US012603467B2

(12) United States Patent
Ahlgrimm

(10) Patent No.: US 12,603,467 B2
(45) Date of Patent: Apr. 14, 2026

(54) METHOD FOR AUTOMATED MONITORING OF A SOLDERING PROCESS, SOLDERING DEVICE WITH MONITORING DEVICE

(71) Applicant: ERSA GmbH, Wertheim (DE)

(72) Inventor: Timon Ahlgrimm, Marktheidenfeld (DE)

(73) Assignee: ERSA GMBH, Wertheim (DE)

( * ) Notice: Subject to any disclaimer, the term of this patent is extended or adjusted under 35 U.S.C. 154(b) by 34 days.

(21) Appl. No.: 18/419,916

(22) Filed: Jan. 23, 2024

(65) Prior Publication Data

US 2024/0250488 A1 Jul. 25, 2024

(30) Foreign Application Priority Data

Jan. 24, 2023 (DE) ..................... 10 2023 101 710.1

(51) Int. Cl.
  *B23K 3/00* (2006.01)
  *H01R 43/02* (2006.01)
  *H05K 13/08* (2006.01)

(52) U.S. Cl.
  CPC ........... *H01R 43/0242* (2013.01); *B23K 3/00* (2013.01); *H05K 13/0817* (2018.08)

(58) Field of Classification Search
  CPC .. B23K 2101/42; B23K 1/0016; B23K 1/018; B23K 3/08; B23K 3/033; B23K 3/0478;
  (Continued)

(56) References Cited

U.S. PATENT DOCUMENTS

| | | | | | |
|---|---|---|---|---|---|
| 4,501,770 A | * | 2/1985 | Bajka | ..................... | B23K 1/018 |
| | | | | | 427/98.2 |
| 2003/0213832 A1 | * | 11/2003 | Kang | ..................... | B23K 1/206 |
| | | | | | 228/180.22 |

(Continued)

FOREIGN PATENT DOCUMENTS

| | | | |
|---|---|---|---|
| AT | 393 099 B | 8/1991 |
| DE | 20 2013 102 221 U1 | 6/2013 |

(Continued)

OTHER PUBLICATIONS

Spain Office Action for Application No. 202430054 dated Oct. 7, 2024 with English Translation, 18 pages.

(Continued)

*Primary Examiner* — Erin B Saad
(74) *Attorney, Agent, or Firm* — Carter, DeLuca & Farrell LLP

(57) ABSTRACT

A method for heating a substrate (12) and/or an electronic component (14) arranged on the substrate (12) for desoldering and/or soldering the component (14) by a soldering device (10) with an energy dissipation (E), a device position ($P_{x,y,z}$), and/or a device acceleration ($a_{x,y,z}$). The soldering device (10) heats a soldering point (20) on the substrate (12) and/or on the component (14) by heat conduction, heat radiation, and/or heat convection, and has a first energy dissipation (E), a first device position ($P_{x,y,z}$), and/or a first device acceleration ($a_{x,y,z}$). The soldering device (10) moves towards and/or away from the soldering point (20), has a second energy dissipation (E), a second device position ($P_{x,y,z}$), and/or a second device acceleration ($a_{x,y,z}$). The state of the soldering point (20), the substrate (12), and/or the component (14) depends on time series of the energy dissipation (E), the device position ($P_{x,y,z}$), and/or the device acceleration ($a_{x,y,z}$).

6 Claims, 4 Drawing Sheets

(58) Field of Classification Search
CPC ...... B23K 1/00; B23K 3/02; H05K 2203/176;
H05K 1/11; H05K 13/00; H05K 13/08;
H05K 13/0817; H05K 2201/0308
See application file for complete search history.

(56)                        References Cited

U.S. PATENT DOCUMENTS

| | | | | |
|---|---|---|---|---|
| 2009/0065557 | A1* | 3/2009 | Chapman | ........... H05K 13/0491 |
| | | | | 228/264 |
| 2012/0132694 | A1* | 5/2012 | Buchwalter | ............. H01L 24/11 |
| | | | | 228/33 |
| 2016/0007457 | A1* | 1/2016 | Kline | ...................... H01L 24/98 |
| | | | | 228/264 |
| 2019/0076950 | A1 | 3/2019 | Becker et al. | |
| 2020/0016674 | A1 | 1/2020 | Matsuzaki et al. | |
| 2021/0063316 | A1 | 3/2021 | Endou et al. | |
| 2022/0201255 | A1* | 6/2022 | Matsuzaki | ............... B23K 3/03 |
| 2023/0405701 | A1* | 12/2023 | Ahlgrimm | ........... B23K 1/0016 |
| 2024/0250488 | A1* | 7/2024 | Ahlgrimm | ............... B23K 3/02 |

FOREIGN PATENT DOCUMENTS

| | | | |
|---|---|---|---|
| DE | 20 2020 106 614 | U1 | 3/2022 |
| DE | 102020130466 | A1 | 5/2022 |
| DE | 102020130468 | A1 | 5/2022 |
| EP | 1957226 | B1 | 12/2013 |
| JP | 2020028908 | A | 2/2020 |

OTHER PUBLICATIONS

German Office Action for Application No. 10 2023 101 710.1 dated
Dec. 12, 2023 with English translation.

* cited by examiner

METHOD FOR AUTOMATED MONITORING OF A SOLDERING PROCESS, SOLDERING DEVICE WITH MONITORING DEVICE

BACKGROUND

The invention relates to a method for heating a substrate and/or an electronic component arranged on the substrate, in particular for desoldering and/or soldering the component in a manual soldering process, by means of a soldering device, in particular a soldering hand tool, and preferably a soldering iron.

SUMMARY

The soldering device has an energy dissipation and also has a device position and/or a device acceleration. In a soldering state, the soldering device has a first energy dissipation and also has a first device position and/or a first device acceleration, wherein, in the soldering state, the soldering device heats a soldering point on the substrate and/or on the component by means of heat conduction and/or by means of heat radiation and/or by means of heat convection. During operation, the soldering device further has a second energy dissipation and a second device position and/or a second device acceleration in a handling state, wherein in the handling state the soldering device is moved toward and/or away from the soldering point. The invention further relates to an associated soldering device, in particular a soldering hand tool, and preferably a soldering iron.

The components are generally electronic components, such as memory modules, microprocessors, inverters, VCSEL components, photodiodes, MEMS components, or chip-on-glass components. The substrate on which the components are placed has contact points corresponding to the pins of the components, it being necessary for an accurately positioned alignment during the placement of the components on the substrate to be carried out in such a way that the respective pins of the component come into contact with the contact points of the substrate corresponding thereto. The substrate and the electronic components are connected to one another at soldering points.

For quality control of soldering points, an automatic optical inspection (AOI) by means of a camera system takes place during production according to DE 20-2013-102 221 U1. As a rule, soldered joints are evaluated after production, e.g., on the basis of light reflection, to determine whether the soldered joints are to be considered suitable or defective. Furthermore, it is regarded as critical if the camera systems are used during the production of the soldering point, since the user is continuously filmed.

From AT 393 099 B, a method for manual soldering is known in which a circuit is closed by a contact of a soldering wire with a substrate. This is used to detect the start of the soldering process. After a preset period of time, an optical and/or acoustic signal is passed on to a user in order to maintain a uniform soldering time.

The invention is based on the object of providing a method and/or a soldering device with which a state of a soldering point and/or of a substrate and/or of an electronic component can be detected.

The object of the invention is achieved by a method having the features of claim 1. The method consequently provides that the state of the soldering point and/or of the substrate and/or of the component is determined depending on a time series of the energy dissipation and a time series of the device position and/or a time series of the device acceleration.

The energy dissipation is the heating power over time which is transmitted from the soldering device to the surroundings or to the soldering point and/or the substrate and/or the electronic component by heat conduction and/or heat radiation and/or heat convection. The device position is an X, Y, and Z coordinate and/or an angle $\alpha$, $\beta$, and $\gamma$ of the soldering device. The device acceleration is an acceleration along an X, Y, and Z-axis, and/or an angular acceleration a, b, and c of the soldering device. A time series represents a series of temporally ordered variables or values of a parameter.

On the basis of the energy dissipation and the device position and/or the device acceleration, it can be detected whether the soldering device is in the soldering state or in the handling state. It has been shown that a combination of the time series of the energy dissipation and the time series of the device position and/or the time series of the device acceleration serves as suitable indicators for evaluating the state of the soldering point and/or of the substrate and/or of the component.

The method confers the advantage that during the production of a soldering point in real time, the state of the soldering point and/or of the substrate and/or of the component can be detected in an automated manner. Consequently, it is possible to intervene in the manufacturing process using the monitoring device, so that damage can possibly be prevented. In addition, in evaluating the soldering point the production history, and not only—as in the prior art—the result of the production process, can be taken into account. A camera system can be dispensed with for this purpose. Furthermore, a learning phase is not required, so that the device of the method is particularly simple and fast at the beginning or during a user change. In addition, the method according to the invention is to be regarded as more reliable compared to the prior art, since the production of the soldering point can be determined using the solder state of the soldering device and not on the basis of contacting a solder material with a substrate or with a component.

An advantageous development provides that the soldering state is determined in that there is a high first energy dissipation and/or a defined, previously known first device position and/or a low first device acceleration. If the soldering device contacts the soldering point in the soldering state, then due to the heat conduction a high first energy dissipation and/or a constant, preferably known, first device position and/or a low first device acceleration is to be expected.

It is also advantageous if the handling state is determined in that there is a low second energy dissipation and/or an undefined, unknown second device position and/or a high second device acceleration. If the soldering device is handled freely in space in the handling state, then, due to the heat convection and/or heat radiation to the ambient atmosphere, a low second energy dissipation, and/or due to the handling a variable, preferably unknown second device position, and/or a high second device acceleration, are to be expected.

The first energy dissipation is here to be viewed in relation to the second energy dissipation, where the first energy dissipation is designed greater than the second energy dissipation. The ratio between the first energy dissipation and the second energy dissipation can in particular be greater than 3:1, preferably greater than 5:1, and preferably greater than 10:1. The same holds for the first device position and the second device position, wherein the first device position is arranged in a first three-dimensional space and wherein the second device position is arranged in a second three-dimensional space. The first three-dimensional space is preferably designed to be smaller than the second three-dimensional space.

Furthermore, the first device acceleration is also to be viewed in relation to the second device acceleration, where the first device acceleration is designed to be less than the second device acceleration. The ratio between the first device acceleration and the second device acceleration can in particular be greater than 3:1, preferably greater than 5:1, and preferably greater than 10:1. The soldering state and the handling state of the soldering device can thus be detected particularly easily and reliably.

It is also advantageous if the soldering device has an idle state in addition to the soldering state and the handling state. The soldering device is preferably in the idle state when the soldering device is arranged or hung in a soldering station, or is placed on a support surface. In the idle state, the soldering device can have a third energy dissipation and a third device position and/or a third device acceleration. It is conceivable that the first device acceleration is substantially equal to the third device acceleration. However, the idle state can be detected through the fact that the first energy dissipation is designed greater than the third energy dissipation. If the soldering device is repeatedly brought into the idle state at the same device position, then the idle state of the soldering device can also be inferred on the basis of the third device position.

Advantageously, the energy dissipation is determined over time as a function of a device voltage, a device current, a device power, and/or an output level of the soldering device. Alternatively or additionally, the energy dissipation can be determined over time depending on the temperature of the soldering point and/or of the substrate and/or of the component. It is advantageous if time series of the mentioned parameters are detected, stored, and/or processed. As a result, the energy dissipation of the soldering device can often be deduced from the data already recorded. It is conceivable for the energy dissipation to be determined on the basis of the device power and a temperature detected at the soldering device by comparing the energy required to maintain the temperature with the energy provided by the soldering device.

An advantageous development provides that, the amount of energy introduced into the soldering point and/or into the substrate and/or into the component is determined depending on the time series of the energy dissipation and in particular depending on the time series of the soldering state. Through the time series of the energy dissipation, it is known how much energy was dissipated from the soldering device to the surrounding environment or to the soldering point and/or the substrate and/or the component. Through the time series of the soldering state, it is known when the soldering device was in engagement with the soldering point and/or the substrate and/or the component. Consequently, by combining the two time series, it can be determined how much energy was introduced into the soldering point and/or the substrate and/or the component.

It is further advantageous if the state of the soldering point, in particular its quality and suitability, and/or of the substrate and/or of the component, is inferred based on the introduced amount of energy and/or the time series of the introduced energy. The soldering joint and/or the substrate and/or the component generally have an upper limit for absorbing energy, in particular thermal energy. If the upper limit is exceeded and/or is approached multiple times, it is then possible to infer the defect of the soldering point and/or of the substrate and/or of the component from this in real time.

To improve a user's manual soldering process, it is advantageous if the state of the soldering point and/or the substrate and/or the component is displayed in real time. The displaying can be done for example by text on a display or by means of colors. For example, an LED display can be used which can display the colors red, yellow and green, wherein green is displayed during normal operation. If the upper limit of the energy absorption of the soldering point and/or of the substrate and/or of the component is approached, the color yellow can be displayed. In this case, the user is informed that the soldering at the soldering point should be terminated soon or immediately. If the upper limit is exceeded, the color red is displayed. In this case, the user is informed that the soldering point and/or the substrate and/or the component has a defect. Furthermore, the soldering can be stopped at the soldering point and/or the substrate and/or the component. The LED display can also be combined with an acoustic signal.

It is advantageous if a time series of the energy dissipation and/or a time series of the device position and/or a time series of the device acceleration is detected as a soldering process, in particular with a movement profile of a user. The detected soldering process can in particular be stored in a database. In the database, the soldering process can be assigned to a soldering profile of a user. A soldering profile with a movement profile of a user can be created on the basis of a plurality of soldering processes. As a result, the soldering state and handling state can be detected more reliably based on a user's soldering profile. As a result, the detection of the state of the soldering point and/or of the substrate and/or of the component also becomes more reliable. This is also intended to bring about an improvement with regard to an automated evaluation between a good and a poor soldering point. It is also advantageous if the detected time series are stored in a database for documentation purposes, so that, for example, in case of a later occurring defect, it is possible to access the specific soldering process and the associated parameters.

An advantageous development provides that the evaluation of the soldering state and/or of the handling state and/or of the state of the soldering point and/or of the substrate and/or of the component and/or of the soldering and/or movement profile takes place by classification using statistical classification algorithms. The classification algorithms can here use training and/or reinforcement methods, which can also include artificial intelligence. In this way, it can be evaluated whether the soldering device is in the soldering state and/or in the handling state. Furthermore, in this way it can be assessed whether the soldering point and/or the substrate and/or the component is free of defects or is defective.

This can be done using a linear classifier which makes classification decisions based on the value of a linear combination of the input data features. The linear classifier can in particular comprise a Fisher linear discriminant, a logistic regression classifier, a naive Bayes classifier, a perceptron classifier, and/or a support vector machine. A non-linear classifier can also be provided for classification. When a non-linear classifier is used, artificial neural networks, generative adversarial networks, support vector machines, k-nearest neighbor, Gaussian mixture models, Naive Bayes, decision trees, and RBF classifiers or the like can be used. The aim is to create an "intelligent prediction of the soldering state and/or the handling state and/or the state of the soldering point and/or of the substrate and/or of the component."

As training data, for the output variable the soldering point according to IPC rules as defect-free and as defective can be used, and for the input variables their time series of the energy dissipation, the device position, and the device acceleration can be used. The "intelligent prediction of the soldering state and/or of the handling state and/or of the state of the soldering point and/or of the substrate and/or of the component" can here take place depending on a trained model having at least two input variables and an output variable.

A soldering device can in particular be designed as a soldering hand tool, and preferably as a soldering iron. The soldering iron can have a heating head that provides heating power. The soldering device is used to heat a substrate and/or an electronic component arranged on the substrate, in particular for desoldering and/or soldering the component in a manual soldering process. The soldering device has an energy dissipation and also has a device position and/or a device acceleration. During operation, the soldering device has a soldering state with a first energy dissipation and also has a first device position and/or a first device acceleration, wherein, in the soldering state, the soldering device heats a soldering point on the substrate and/or on the component by means of heat conduction and/or by means of heat radiation and/or by means of heat convection. During operation, the soldering device further has a second energy dissipation and, in addition, a second device position and/or a second device acceleration in a handling state, wherein in the handling state the soldering device is moved towards and/or away from the soldering point. The soldering device has a monitoring device for monitoring the state of the soldering point and/or of the substrate and/or of the component. The monitoring device is set up to determine the state of the soldering point and/or of the substrate and/or of the component depending on a time series of the energy dissipation and a time series of the device position and/or a time series of the device acceleration of the soldering device. The monitoring device can be arranged in or on the soldering device or be part of a higher-level soldering system, in particular a soldering station.

The soldering device according to the invention confers the advantage that during the production of a soldering point in real time, the state of the soldering point and/or of the substrate and/or of the component can be detected in an automated manner. Consequently, it is possible to intervene in the manufacturing process using the monitoring device, so that damage can possibly be prevented. In addition, in evaluating the soldering point the production history, and not only—as in the prior art—the result of the production process, can be taken into account. A camera system can be dispensed with for this purpose.

Furthermore, a learning phase is not required, so that the setup of the soldering device at the beginning or when there is a change of user is particularly simple and fast. In addition, the soldering device according to the invention can be regarded as more reliable than the prior art, since the production of the soldering point can be determined on the basis of the soldering state of the soldering device, and not on the basis of a contacting of a solder material with a substrate or with a component.

An advantageous development provides that the soldering device has at least one state sensor and also at least one position sensor and/or at least one acceleration sensor. The acceleration sensor can be designed as a gyro sensor or as a geomagnetic sensor. The state sensor generates a state signal which represents the energy dissipation of the soldering device. The position sensor generates a position signal which represents the position, in particular an X, a Y, and a Z coordinate and/or a first angle $\alpha$, a second angle $\beta$, and a third angle $\gamma$, of the soldering device. The acceleration sensor generates an acceleration signal which represents the acceleration along an X, a Y, and a Z-axis and/or the angular acceleration a, b, c. The state sensor and/or the position sensor and/or the acceleration sensor can preferably be arranged in the soldering device and/or in a higher-level soldering system, such as a soldering station. Consequently, the state signal can be used in conjunction with the position signal and/or the acceleration signal in order to determine the energy dissipation and the device position and/or the device acceleration. The acceleration sensor can in particular also be designed as a position and/or speed sensor.

It is advantageous if the at least one state sensor is designed to detect a device voltage of the soldering device, a device current of the soldering device, a device power of the soldering device and/or an output level of the soldering device and/or to detect the temperature of the soldering point and/or of the substrate and/or of the component. Accordingly, the energy dissipation of the soldering device can be inferred using easily measurable variables.

Advantageously, the monitoring device is further configured to receive, store, and/or process the state signal and/or the position signal and/or the acceleration signal.

It is advantageous if the monitoring device is further set up to determine the state of the soldering point and/or of the substrate and/or of the component dependent on a time series of the state signal and/or a time series of the position signal and/or a time series of the acceleration signal. Consequently, with the aid of the sensors used, it is possible to infer the soldering state of the soldering device, so that the energy dissipation, and thus the state of the soldering point, in particular a defective soldering point, can be inferred.

An advantageous development provides that the monitoring device is set up to assign detected soldering operations to a soldering profile of a user, which is in particular stored or is to be stored in a database. A time series of the energy dissipation and/or a time series of the device position and/or a time series of the device acceleration can here be detected as a soldering process, in particular with a movement profile of a user. The time series of a user can be assigned to the user's soldering profile and stored in the database. A soldering profile with a movement profile of a user can be created on the basis of a plurality of soldering processes. As a result, the soldering state and handling state can be detected more reliably based on a user's soldering profile. As a result, the detection of the state of the soldering point and/or of the substrate and/or of the component also becomes more reliable. This is also intended to bring about an improvement with regard to an automated evaluation between a good and a poor soldering point. It is also advantageous if the detected time series are stored in a database for documentation purposes, so that, for example, in case of a later occurring defect, it is possible to access the specific soldering process and the associated parameters.

It is also advantageous if the soldering device has a user interface, in particular an LED display and/or a display, for displaying the energy dissipation and/or the position signal and/or the acceleration signal and/or the soldering state and/or the handling state and/or their time series. Accordingly, on the basis of the user interface a user can better understand the soldering parameters and in particular the soldering result. For example, the user interface can indicate that the user is soldering at an incorrect soldering point, that the energy dissipation is too high or too low, in particular due to a defect or an incorrectly set soldering temperature, and/or that there is excessive vibration during soldering. It is also advantageous if, alternatively or additionally, the user interface is designed to display the state of the soldering point and/or the substrate and/or the component. It is conceivable for the user interface to comprise three colors, wherein the color green is displayed in the case of a good manufacturing process, wherein the color yellow is displayed in the case of a production process approaching the upper limit, and/or wherein the color red is displayed in the case of a defective production process, in particular in the case of a defective soldering point and/or substrate and/or component. Accordingly, the monitoring device supports the user during the soldering process, wherein the user receives an indication before a defect is produced at the soldering point, and can thus possibly prevent the defect. It is advantageous if the monitoring device is also set up to control the user interface for displaying the aforementioned information.

An advantageous development of the invention provides that the soldering device has a control and/or regulation device which is set up to control and/or regulate the energy dissipation of the soldering device depending on the energy dissipation and/or the device position and/or the device acceleration and/or their time series. For example, the control and/or regulation device could reduce the device voltage, the device current, and/or the device power in the event of very high energy dissipation in order to protect the soldering point and/or the substrate and/or the component.

Also according to the invention is a soldering system, in particular a soldering station, with a soldering device, wherein the soldering device for heating a substrate and/or an electronic component arranged on the substrate, in particular for desoldering and/or soldering the component in a manual soldering process. The soldering device has an energy dissipation and also a device position and/or a device acceleration. In a soldering state in which the soldering device heats a soldering point on the substrate and/or on the component by means of thermal conduction and/or by means of thermal radiation and/or by means of thermal convection, the soldering device has a first energy dissipation and a first device position and/or a first device acceleration. In a handling state in which the soldering device is moved towards and/or away from the soldering point, the soldering device has a second energy dissipation and a second device position and/or a second device acceleration. The soldering system further comprises a monitoring device for monitoring the state of the soldering device and/or of the soldering point and/or of the substrate and/or of the component. The monitoring device is set up to determine the state of the soldering point and/or of the substrate and/or of the component depending on a time series of the energy dissipation and a time series of the device position and/or a time series of the device acceleration of the soldering device. The monitoring device can be arranged in or on the soldering system. Furthermore, the soldering system can have a user interface for displaying the energy dissipation and/or the soldering state and/or the device position and/or device acceleration and/or the state of the soldering point and/or of the substrate and/or of the component. Furthermore, the soldering system can comprise a control and/or regulation device for controlling and/or regulating the soldering device depending on the state of the soldering point and/or of the substrate and/or of the component and/or the state of the soldering device.

The soldering device can also be arranged on an automatically soldering system, such as for example on a soldering robot. The soldering system can be the automatic soldering system. A continuous process improvement can be achieved using the soldering device according to the invention and/or the soldering system according to the invention.

The soldering device can furthermore have a soldering tip that can be identified by the soldering device and/or by the soldering system. In addition, a multi-axis acceleration sensor, for example a 6-axis acceleration sensor, is provided on or on the soldering device and/or in or on the soldering system, said acceleration sensor in particular detecting the acceleration along the X, Y and Z axis and the angular acceleration a, i.e., rotation about the X axis, b, i.e., rotation about the Y axis and c, i.e., rotation about the Z axis. In this case, the optimal angle of the soldering device between the soldering tip and the soldering point can be detected. The user interface can also be set up to display the detected angle in real time. In this way, the user can be trained and can recognize in real time how the angle of the soldering device can be optimized, in particular by an angle correction. This development is particularly advantageous for soldering tips having a beveled end face or a soldering tip having a notch. The optimal contact surface of the end face of the soldering tip at the soldering point, and also the optimal contact of the notch of the soldering tip on the electronic component to be soldered, ensures an optimal heat transfer and thus the best possible soldering point, with a low heat input.

Further details and advantageous embodiments of the invention can be found in the following description, by which embodiments of the invention are further described and explained.

BRIEF DESCRIPTION OF THE DRAWINGS

FIG. 2b shows a schematic side view of the use according to FIG. 2a;

FIG. 3b shows a schematic side view of the use according to FIG. 3a;

DETAILED DESCRIPTION

In the following description and in the figures, identical reference signs are in each case used for identical or corresponding features.

Figure 1:
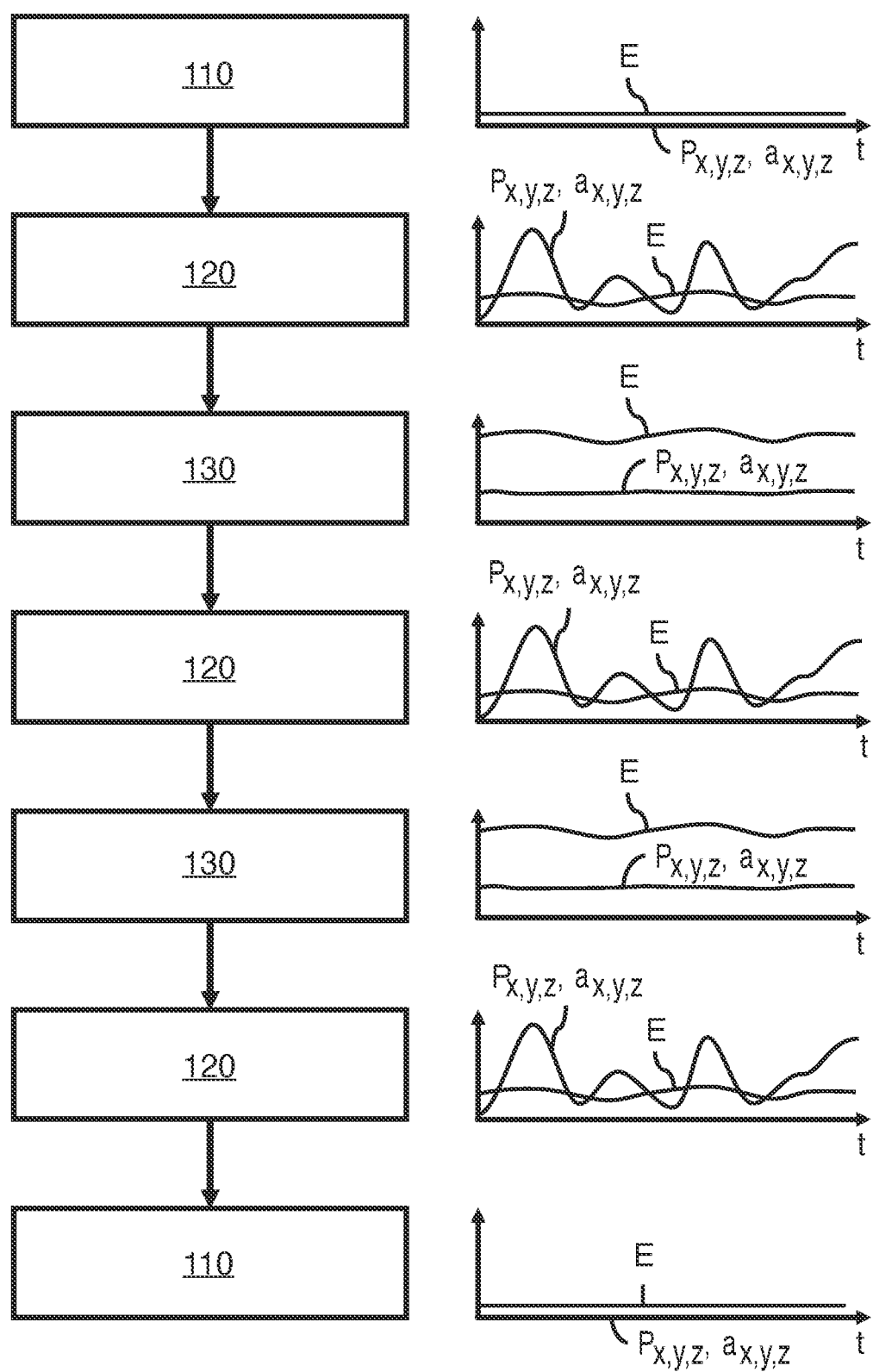
FIG. 1 shows a block diagram of a method according to the invention.
Figure 2A:
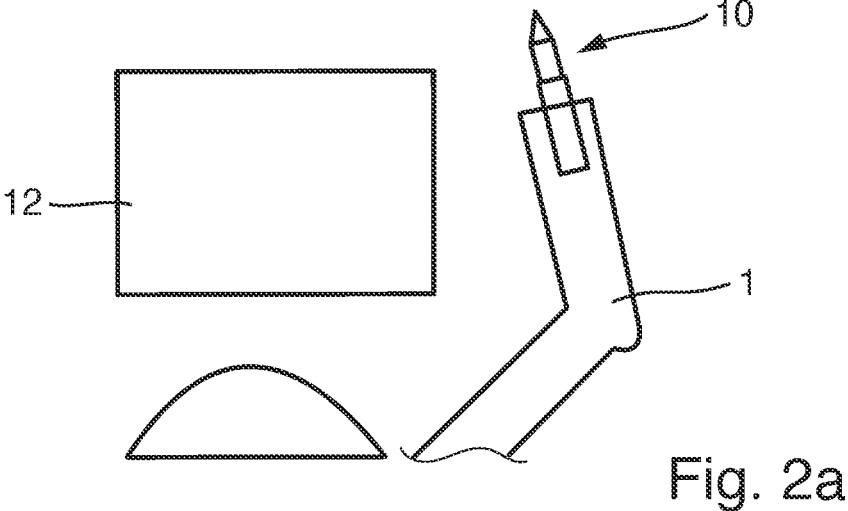
FIG. 2a shows a schematic plan view of a use of the soldering device according to the invention, wherein the soldering device is in the handling state.
Figure 2B:
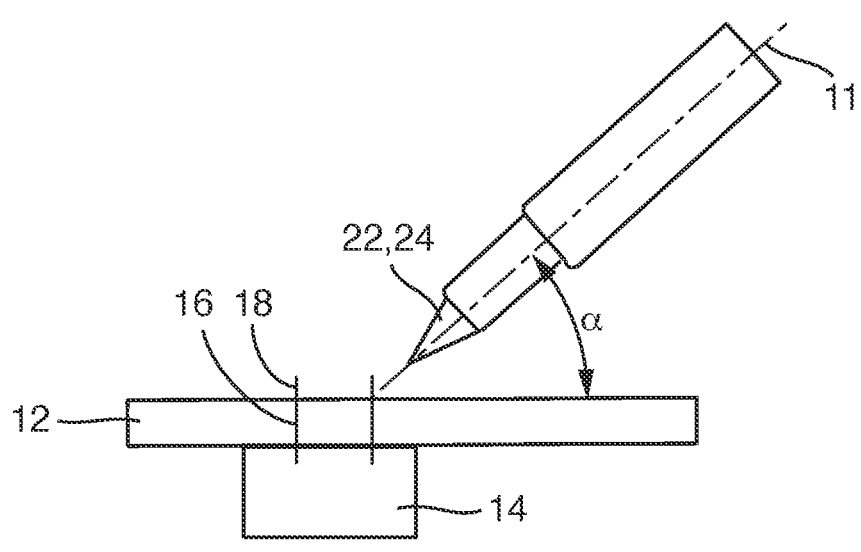
Figure 3A:
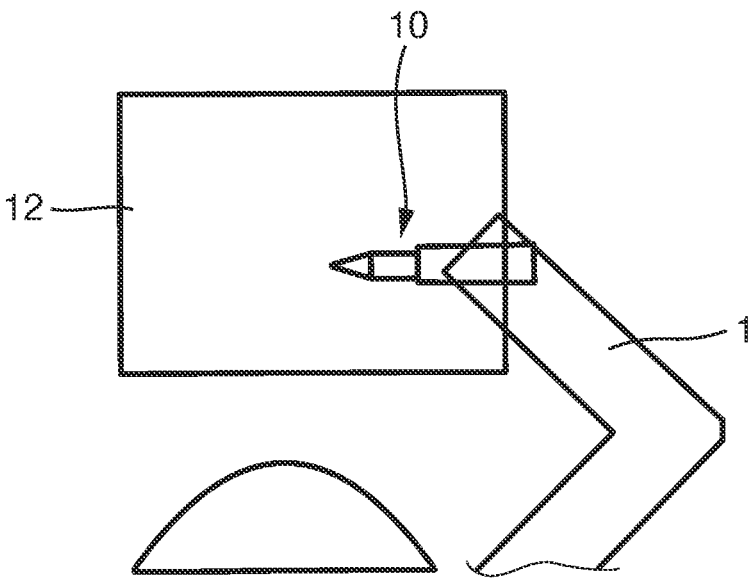
FIG. 3a shows a schematic plan view of a use of the soldering device according to the invention, wherein the soldering device is in the soldering state.
Figure 3B:
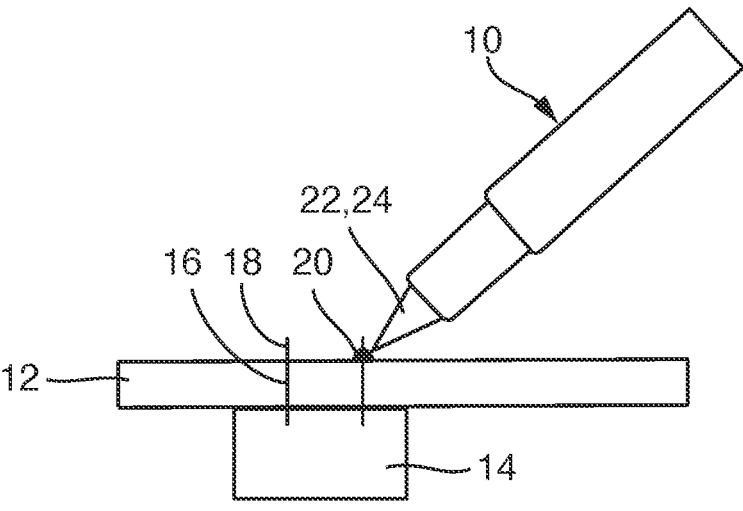
Figure 4:
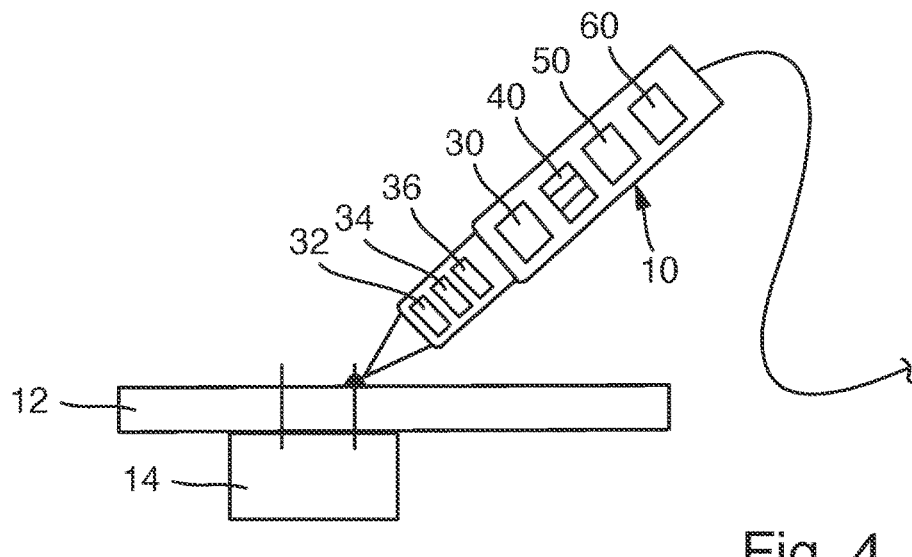
FIG. 4 shows a soldering device according to the invention.

According to FIG. 1, the soldering device 10 can have, inter alia, an idle state 110, a handling state 120, and a soldering state 130. FIGS. 2a and 2b show the soldering device in the handling state 120 and FIGS. 3a and 3b show it in the soldering state 130.

FIGS. 2a to 3b show a soldering device 10 according to the invention, in particular a soldering iron, for heating a substrate 12 and an electronic component 14 arranged on the substrate 12, in particular for desoldering and/or soldering the component 14 in a manual soldering process. In preparation for the soldering process, the component 14 is placed onto the substrate 12. For this purpose, the substrate 12 has contact points 16 which correspond to pins 18 arranged on the component 14. To connect the substrate 12 to the component 14, the pins 18 are first inserted into the contact points 16, the contact points 16 preferably being formed as through-holes. When the components 14 are placed on the substrate 12, they must be aligned in the exact position so that the respective pins 18 of the component 14 come into contact with the corresponding contact points 16 of the substrate 12.

The substrate 12 and the electronic components 14 are connected to one another with soldering points 20. To produce a soldering point 20, the substrate 12 and/or the component 14 and/or a supplied solder material (not shown) is heated. For this purpose, the soldering device 10 has a preferably replaceable soldering tip 22 with a heating head 24. The soldering device 10, in particular the soldering tip 22, provides the heating power required to melt the solder material. In this state, the soldering device is in the soldering state 130.

Before, during and after the production of a soldering point 20, the soldering device 10 can be removed from the soldering point 20. This is done both at the beginning and at the end of the production of a soldering point 20, as well as during production for control purposes and for readjustment. In this state, the soldering device 10 is in the handling state 120.

When the soldering device 10 is not in use, the soldering device 10 is in an idle state 110.

In particular during manual production of soldering points 20 by means of a soldering device 10, in particular a soldering hand tool, a quality control of the soldering points 20 is absolutely necessary due to the greatly varying abilities of a user 1. For this purpose, with an AOI the prior art provides a control mechanism following production. It is also disadvantageous to use an AOI during production, since the user is continuously being recorded by a camera system. An essential parameter in the evaluation of a soldering point 20 is the energy introduced into the soldering point 20. However, in a manual soldering process it is challenging to determine whether the soldering device 10 is in an idle state 110, a handling state 120, or a soldering state 130.

The block diagram shows which parameters of the soldering device 10 are to be monitored in order to determine an idle state 110, a handling state 120, and a soldering state 130 of the soldering device 10. The parameters are an energy dissipation E and a device position $P_{x,y,z}$ and a device acceleration $a_{x,y,z}$ of the soldering device. The energy dissipation E is the heating power over time, which is transferred from the soldering device 10 to the environment or to the soldering point 20 and/or the substrate 12 and/or the electronic component 14 by heat conduction and/or heat radiation and/or heat convection. The device position $P_{x,y,z}$ is an X, Y, and Z coordinate and/or an angle α, β, and γ of the soldering device. The device acceleration $a_{x,y,z}$ is an acceleration along an X, Y, and Z axis, and/or an angular acceleration a, b, and c of the soldering device. A time series represents a series of temporally ordered variables or values of a parameter.

The soldering device 10 is initially in idle state 110. In this case, the soldering device 10 is in standby mode, e.g., on a work table (not shown). Subsequently, according to FIGS. 2a and 2b, in a handling state 120 the soldering device 10 is grasped by a user 1 and is moved in space. The soldering device 10 is switched on in such a way that heating power is provided to heat the soldering point 20. For the soldering, the soldering device 10 comes into contact with the soldering point 20 as shown in FIGS. 3a and 3b, and is in the soldering state 130.

The energy dissipation E, the device position P and the device acceleration $A_{x,y,z}$ differ depending on whether the soldering device is in the idle state 110, the held state 120, or the soldering state 130.

In the soldering state 130, the soldering device 10 has a first energy dissipation E, a first device position $P_{x,y,z}$ and a first device acceleration $A_{x,y,z}$. In addition to the block of the soldering state 130, a time series of the first energy dissipation E, the first device position $P_{x,y,z}$, and the first device acceleration $a_{x,y,z}$ is shown. In the soldering state 130, the first energy dissipation E is at a high level, as there is heat conduction due to the contact between the soldering device 10 and the soldering point 20. Furthermore, the first device position $P_{x,y,z}$ and the first device acceleration $a_{x,y,z}$ have a small fluctuation range, as the soldering device 10 is held steady by the user 1 through contact at a defined point. It is also conceivable for the first device position $P_{x,y,z}$ to be already known beforehand if the soldering point 20 is at a defined position.

In the handling state 120, the soldering device 10 has a second energy dissipation E, a second device position $P_{x,y,z}$ and a second device acceleration $a_{x,y,z}$. In addition to the block of the soldering state 120, a time series of the second energy dissipation E, of the second device position $P_{x,y,z}$, and of the second device acceleration $a_{x,y,z}$ is shown. In the handling state 120, the second energy dissipation E has a medium level, because only heat convection is present, due to the surrounding atmosphere. Furthermore, the second device position $P_{x,y,z}$ and the second device acceleration $a_{x,y,z}$ exhibit a high fluctuation range, since holding the device in space is accompanied by movement at the soldering device 10.

In the idle state 110, the soldering device 10 has a third energy dissipation E, a third device position $P_{x,y,z}$, and a third device acceleration $a_{x,y,z}$. In addition to the block of the idle state 110, a time series of the third energy dissipation E, of the third device position $P_{x,y,z}$, and of the third device acceleration $a_{x,y,z}$ is shown. In the handling state 120, the third energy dissipation E has a low level, because the soldering device is in standby mode. Furthermore, the third device position $P_{x,y,z}$ and the third device acceleration a exhibit a low fluctuation range, since laying the manual device down is not accompanied by movement by the user 1. It is also conceivable for the third device position $P_{x,y,z}$ of the idle state 110 to be defined.

It is conceivable to use the energy dissipation E, the device position $P_{x,y,z}$, and the device acceleration $a_{x,y,z}$ to evaluate the soldering state. It is alternatively conceivable to use either the device position $P_{x,y,z}$ or the device acceleration $a_{x,y,z}$ in addition to the energy dissipation E.

On the basis of the time series of the soldering state 130 and the time series of the first energy dissipation E, it can be determined how much energy was supplied to the soldering point 20. If the energy supplied to the soldering point 20 exceeds a critical upper limit, the soldering point 20 can be evaluated as defective. The user 1 can also be warned if a critical upper soldering point limit is about to be exceeded. Consequently, the quality of the soldering point 20 can be evaluated in real time and feedback on the quality of the soldering point 20 and/or a warning in the event of excessive heat can also be provided to the user 1. Such feedback can also be provided about the state of the substrate 12 and of the component 14.

In order to carry out the method according to the invention, the soldering device 10 has a monitoring device 30 for monitoring the state of the soldering point 20 and/or of the substrate 12 and/or of the component 14. The monitoring device 30 receives a state signal for the energy dissipation E of the soldering device 10 from a state sensor 32 arranged in the soldering device 10. The monitoring device 30 also receives an acceleration signal for the acceleration $a_{x,y,z}$ of the soldering device 10 from an acceleration sensor 34 arranged in the soldering device 10. The monitoring device 30 additionally or alternatively receives a position signal about the position $P_{x,y,z}$ of the soldering device 10 from a position sensor 36 arranged in the soldering device 10.

The monitoring device 30 is set up to receive, store, and process the state signal and/or the acceleration signal and/or the position signal in such a way that the idle state 110, the handling state 120, and the soldering state 130, as well as the energy introduced into the soldering point 20, are detected.

Furthermore, the soldering device 10 has an integrated user interface 40 for displaying the state of the soldering point 20 and/or of the substrate 12 and/or of the component 14. The user interface 40 preferably has an LED display in green, yellow, and red. Using the user interface 40, the monitoring device 30 can give the user 1 feedback about the process, in particular about the soldering point 20.

The monitoring device 30 is further set up to detect, by means of a 6-dimensional acceleration sensor 34 during the soldering state 130, an angle α enclosed by the soldering device 10 and the soldering point 20, in particular a soldering device axis 11 of the soldering device 10 and the pin 18 or the soldering device axis 11 of the soldering device 10 and the substrate 12, and to display it on the user interface 40. It is also conceivable for the user 1 to receive a signal from the user interface to correct the angle α.

In addition to the monitoring device 30, the soldering device can also have an integrated control and regulation device 50. The control and/or regulation device 50 is set up in such a way as to control and/or to regulate the energy dissipation E of the soldering device 10 depending on the time series of the energy dissipation E and/or the time series of the device position $P_{x,y,z}$ and/or the time series of the device acceleration $a_{x,y,z}$. If a critical upper limit of the energy supplied to the soldering point 20 has been exceeded and the soldering device 10 is still located at the soldering point 20, the heating power can for example be throttled down by the control and regulation device 50. If a high energy dissipation E and a high device acceleration $a_{x,y,z}$ are detected, the heating power can for example also be throttled down by the control and regulation device 50 in order to avoid a faulty soldering point.

In order to further improve the prediction of the soldering state 130 and/or the classification of the soldering point 20, the soldering device also has a processor and memory unit 60, wherein this 60 stores and manages a database with soldering profiles and/or with movement profiles of the users 1. Based on the soldering profiles and/or movement profiles, a more targeted prediction can be made about the soldering state 130 and the quality of the soldering point 20. It is conceivable that the classification regarding the soldering condition and the state of the soldering point, as well as the provision of a soldering profile, could be carried out using artificial intelligence.

Figure 5:
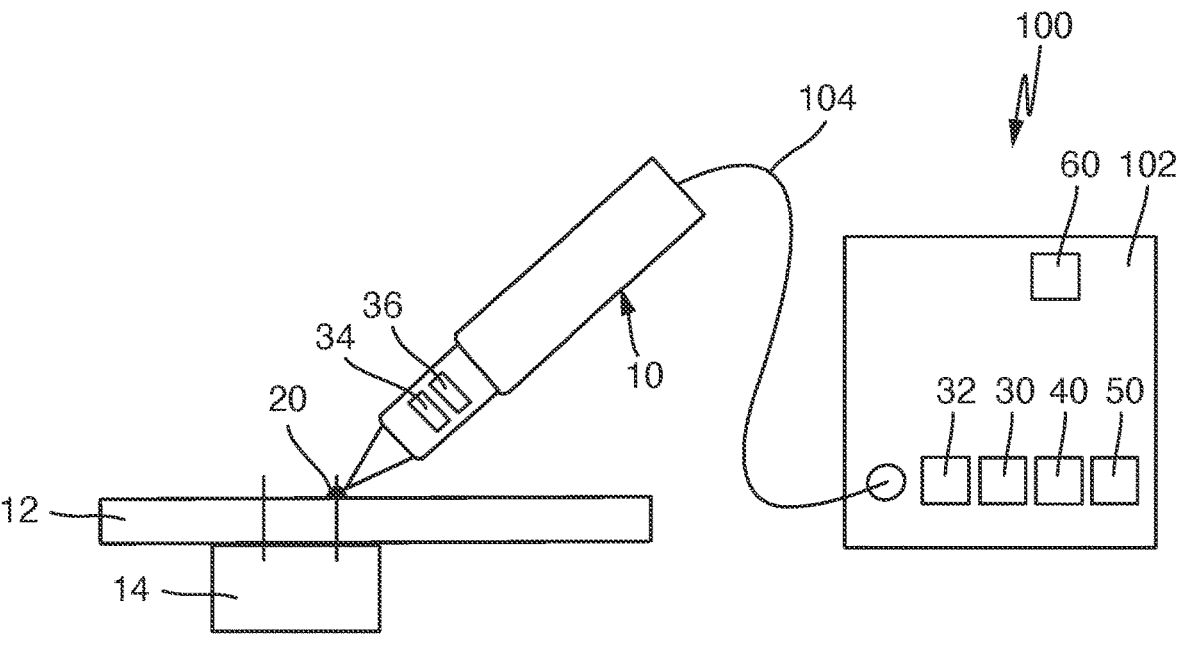
FIG. 5 shows a soldering system according to the invention.

Furthermore, FIG. 5 shows a soldering system 100 according to the invention with a soldering device 10 and with a base housing 102, wherein the soldering system 100 can in particular be designed as a soldering station. The soldering device 10 is connected to the base housing via a line 104. Here the soldering device 10 has a position sensor 36 and/or an acceleration sensor 34. The state sensor 32, the monitoring device 30, and the user interface 40 and/or the control and regulation device 50 and/or the processor and memory unit 60 are provided in the base housing 102.

Persons skilled in the art will understand that the structures and methods specifically described herein and illustrated in the accompanying figures are non-limiting exemplary aspects, and that the description, disclosure, and figures should be construed merely as exemplary of aspects. It is to be understood, therefore, that the present disclosure is not limited to the precise aspects described, and that various other changes and modifications may be affected by one skilled in the art without departing from the scope or spirit of the disclosure. Additionally, it is envisioned that the elements and features illustrated or described in connection with one exemplary aspect may be combined with the elements and features of another without departing from the scope of the present disclosure, and that such modifications and variations are also intended to be included within the scope of the present disclosure. Indeed, any combination of any of the presently disclosed elements and features is within the scope of the present disclosure. Accordingly, the subject matter of the present disclosure is not to be limited by what has been particularly shown and described.

What is claimed is:

1. A soldering device for heating a substrate and/or an electronic component arranged on the substrate for desoldering and/or soldering the component in a manual soldering process, the soldering device comprising an energy dissipation parameter and a device position and/or a device acceleration, wherein the soldering device is configured to assume a soldering state, in which the soldering device heats a soldering point on the substrate and/or on the component by heat conduction and/or by heat radiation and/or by heat convection, and a handling state, in which the soldering device is moved toward and/or away from the soldering point, wherein the soldering device has a first energy dissipation in the soldering state and a second energy dissipation in the handling state, the first energy dissipation being greater than the second energy dissipation, wherein the soldering device has a first device position in the soldering state and a second device position in the handling state, and/or a first device acceleration in the soldering state and a second device acceleration in the handling state, the first device acceleration being less than the second device acceleration, wherein the soldering device comprises at least one state sensor generating a state signal indicative of the energy dissipation of the soldering device, wherein the soldering device further comprises at least one position sensor generating a position signal for detecting a time series of the device position of the soldering device and/or at least one acceleration sensor generating an acceleration signal for detecting a time series of the device acceleration of the soldering device, wherein the soldering device further comprises a monitoring device for monitoring the soldering state, the handling state, and a state of the soldering point and/or of the substrate and/or of the component, wherein the monitoring device is configured to determine the soldering state by measuring a predetermined first device position and/or a first device acceleration within a first acceleration range, wherein the monitoring device is configured to determine the handling state by measuring a second device position that is not predetermined and/or a second device acceleration within a second acceleration range, and wherein the monitoring device is configured to determine the state of the soldering point and/or of the substrate and/or of the component based on a time series of the energy dissipation and/or a time series of the device position and/or a time series of the device acceleration.

2. The soldering device according to claim 1, wherein the at least one state sensor is configured to detect a device voltage, a device current, a device power and/or an actuating variable of the soldering device and/or to detect a temperature of the soldering device and/or of the soldering point and/or of the substrate and/or of the component.

3. The soldering device according to claim 1, wherein the monitoring device is further configured to:

receive, store, and/or process the state signal generated by the at least one state sensor and/or the position signal generated by the at least one position sensor and/or the acceleration signal generated by the at least one acceleration sensor, and determine the state of the soldering point and/or of the substrate and/or of the component depending on a time series of the state signal and/or a time series of the position signal and/or a time series of the acceleration signal.

4. The soldering device according to claim 1, wherein the monitoring device is further configured to assign detected soldering processes to a soldering profile of a user.

5. The soldering device according to claim 1, further comprising a user interface for displaying the state of the soldering point and/or of the substrate and/or of the component, and wherein the monitoring device is further configured to control the user interface to display the state of the soldering point and/or of the substrate and/or of the component.

6. The soldering device according to claim 1, further comprising a control and/or regulation device which is configured in such a way as to control and/or to regulate the energy dissipation of the soldering device depending on the time series of the energy dissipation and/or the time series of the device position and/or the time series of the device acceleration.

*    *    *    *    *